United States Patent
Kum et al.

(10) Patent No.: US 8,981,359 B2
(45) Date of Patent: Mar. 17, 2015

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Do-Young Kum, Daegu (KR); Jun-Ho Lee, Seoul (KR); Young-Hoon Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/954,629

(22) Filed: Jul. 30, 2013

(65) Prior Publication Data
US 2014/0175394 A1    Jun. 26, 2014

(30) Foreign Application Priority Data

Dec. 21, 2012  (KR) .................. 10-2012-0150716
Jun. 28, 2013  (KR) .................. 10-2013-0075523

(51) Int. Cl.
*H01L 35/24*   (2006.01)
*H01L 51/00*   (2006.01)
*H01L 27/32*   (2006.01)
*H01L 51/52*   (2006.01)

(52) U.S. Cl.
CPC ........ *H01L 27/3258* (2013.01); *H01L 51/5246* (2013.01)
USPC .............................. 257/40; 257/368; 438/104

(58) Field of Classification Search
USPC .................. 257/40, 43, E51.018; 438/104
See application file for complete search history.

(56) References Cited

U.S. PATENT DOCUMENTS

| | | | |
|---|---|---|---|
| 2010/0230664 A1* | 9/2010 | Yamazaki et al. | 257/40 |
| 2012/0205660 A1* | 8/2012 | Arai et al. | 257/72 |
| 2012/0249915 A1* | 10/2012 | Morosawa | 349/43 |
| 2013/0078762 A1* | 3/2013 | Akimoto et al. | 438/104 |
| 2013/0313545 A1* | 11/2013 | Saito et al. | 257/43 |

* cited by examiner

*Primary Examiner* — Phuc Dang
(74) *Attorney, Agent, or Firm* — Birch, Stewart, Kolasch & Birch, LLP

(57) ABSTRACT

An organic light emitting diode display device and method of fabricating the device according to an embodiment includes a substrate; an oxide semiconductor layer over the substrate; a planarization layer over the oxide semiconductor layer; an emitting diode over the planarization layer; a passivation layer over the emitting diode; and a hydrogen blocking layer between the planarization layer and the passivation layer to block hydrogen diffusion from the passivation layer to the oxide semiconductor layer.

20 Claims, 10 Drawing Sheets

ORGANIC LIGHT EMITTING DIODE DISPLAY DEVICE AND METHOD OF FABRICATING THE SAME

The present application claims the benefit of Korean Patent Application Nos. 10-2012-0150716 and 10-2013-0075523 filed in Korea on Dec. 21, 2012 and Jun. 28, 2013, respectively, both of which are herein incorporated by reference.

BACKGROUND

1. Technical Field

The present invention relates to an organic light emitting diode (OELD) display device, and more particularly, to an OLED display device including an oxide semiconductor layer.

2. Related Art

An OLED display device of new flat panel display devices has high brightness and low driving voltage. The OLED display device is a self-emitting type and has excellent characteristics of, for example, a view angle, a contrast ratio, a response time.

In addition, there is a big advantage in a production cost. A fabricating process of the OLED display device is very simple and requires a deposition apparatus and an encapsulating apparatus.

The OLED display device includes a plurality of pixel sub-regions in a pixel region. In each of the pixel sub-regions, a switching thin film transistor (TFT) and a driving TFT are formed. Generally, the TFTs are formed by using amorphous silicon as a semiconductor material.

Recently, to meet requirements of large size and high resolution, the OLED display device including the TFTs having faster signal process, more stable operation and durability is required. However, the TFT using amorphous silicon has a relatively low mobility, e.g., less than 1 cm$^2$/Vsec, and there is a limitation for the large and high resolution OLED display device.

Accordingly, an oxide TFT including an active layer of an oxide semiconductor material, which has an excellent electrical property, e.g., mobility and off-current, can be used to obviate some of these shortcomings.

FIG. 1 is a cross-sectional view of an OLED display device according to related art. As shown in FIG. 1, an OLED display device 10 includes first and second substrates 20 and 56, a driving TFT Td and an emitting diode D on the first substrate 20, and a seal layer 54 covering an entire surface between the first and second substrates 20 and 56.

The first and second substrates 20 and 56, which face together and are separated from each other, include a plurality of pixel sub-regions in a pixel region. The first substrate 20 may be referred to as a lower substrate, a TFT substrate or a backplane. The second substrate 56 may be referred to as an incapsulation substrate.

A gate electrode 22 is formed on the first substrate 20, and a gate insulating layer 24 is formed on the gate electrode 22. An oxide semiconductor layer 26 corresponding to the gate electrode 22 is formed on the gate insulating layer 24, and an etch stopper 28 is formed on the oxide semiconductor layer 26. In addition, a source electrode 30 and a drain electrode 32 are formed at both ends of the etch stopper 28 and the oxide semiconductor layer 26.

The gate electrode 22, the oxide semiconductor layer 26, the source electrode 30 and the drain electrode 32 constitute the driving TFT Td.

A first passivation layer 34 is formed on the driving TFT Td, and a color filter layer 36 is formed on the first passivation layer 34 and in each of the pixel sub-regions.

A planarization layer 38 is formed on the color filter layer 36 to remove a step difference, and a first electrode 40 corresponding to the color filter layer 36 is formed on the planarization layer 38. A drain contact hole exposing the drain electrode 32 of the driving TFT Td is formed through the first passivation layer 34 and the planarization layer 38, and the first electrode 40 is connected to the drain electrode 32 through the drain contact hole.

A bank 44 covering edges of the first electrode 40 is formed on the first electrode 40. In other words, the bank 44 includes an opening such that a center of the first electrode 40 is exposed.

An emitting layer 46, which contacts the first electrode 40 through the opening of the bank 44, is formed on the bank 44, and a second electrode 48 is formed on the emitting layer 46.

The first electrode 40, the emitting layer 46 and the second electrode 48 constitute the emitting diode D.

In addition, a second passivation layer 52 is formed on the emitting diode D. The seal layer 54 is formed on an entire surface of the second passivation layer 52 and the second substrate 56 such that the first and second substrates 20 and 56 are attached together.

In the OLED display device according to related art, damage to the emitting diode D resulting from an impact of outer moisture and particles is prevented by the second passivation layer 52. As described above, the second passivation layer 52 is formed over an entire surface of the first substrate 20 and the second passivation layer 52 covers the pixel region.

The second passivation layer 52 is formed by a plasma chemical vapor deposition (PCVD) apparatus or a physical vapor deposition (PVD) apparatus such as a sputter. For example, the second passivation layer 52 may be a silicon nitride (SiNx) layer, a silicon oxide nitride (SiON) layer or a silicon oxide (SiOx) layer formed in the PCVD apparatus or an alumina (AlOx) layer formed in the sputter.

However, when the second passivation layer 52 is formed of silicon compound in the PCVD apparatus or the PVD apparatus, the deposition process should be performed under a low temperature (e.g., less than about 100° C.) to prevent thermal degradation of the emitting layer 46. Due to the low process temperature, source gases do not completely react and hydrogen (H) residues from the source gases such as silane (SiH4) gas or ammonia (NH3) gas are generated in the second passivation layer 52.

The hydrogen residues are diffused into the oxide semiconductor layer 26 of the driving TFT Td through the planarization layer 38 and the first passivation layer 34 thereby generating a reduction process of the oxide semiconductor material of the oxide semiconductor layer 26.

As a result of the reduction of the oxide semiconductor which causes a threshold voltage shift of the driving TFT Td, brightness differences in an image are generated and a displaying quality of the OLED display device is decreased.

In addition, excessive currents created by the threshold voltage shift of the driving TFT Td can cause thermal damage to the OLED display device when the OLED display device is operated over a long period of time.

SUMMARY

Accordingly, the present invention is directed to an OLED display device that substantially obviates one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In accordance with the present invention, as embodied and broadly described herein, an organic light emitting diode display device according to an embodiment of the present invention includes a substrate; a gate line, a data line and a power line on the substrate, the gate and data lines crossing each other to define a pixel region; a thin film transistor in the pixel region; a first passivation layer on the thin film transistor; an emitting diode over the passivation layer and in the pixel region; a second passivation layer over the emitting diode; and a hydrogen blocking layer between the thin film transistor and the second passivation layer.

In another aspect, a method of fabricating an organic light emitting diode display device includes forming a gate line, a data line and a power line on a substrate, the gate and data lines crossing each other to define a pixel region; forming a thin film transistor in the pixel region; forming a first passivation layer on the thin film transistor; forming a hydrogen blocking layer over the first passivation layer, the hydrogen blocking layer corresponding to the thin film transistor; forming an emitting diode over the passivation layer; and forming a second passivation layer over the emitting diode.

In another aspect, a method of fabricating an organic light emitting diode display device includes forming a gate line, a data line and a power line on a substrate, the gate and data lines crossing each other to define a pixel region; forming a thin film transistor in the pixel region; forming a first passivation layer on the thin film transistor; forming an emitting diode over the passivation layer; forming a hydrogen blocking layer on the emitting diode; and forming a second passivation layer over the emitting diode.

In another aspect, an organic light emitting diode display device includes a substrate; gate lines, data lines and power lines on the substrate, the gate and data lines crossing each other to define a plurality of pixel regions; a thin film transistor in the pixel region; a planarization layer over the thin film transistor; a first electrode on the planarization layer in each pixel region; an emitting layer on the first electrode; a second electrode on the emitting layer and covering the plurality of pixel regions; a second passivation layer on the second electrode; and a hydrogen blocking layer covers the planarization layer exposed between the second passivation layer and the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the preferred embodiments, examples of which are illustrated in the accompanying drawings.

Figure 2:
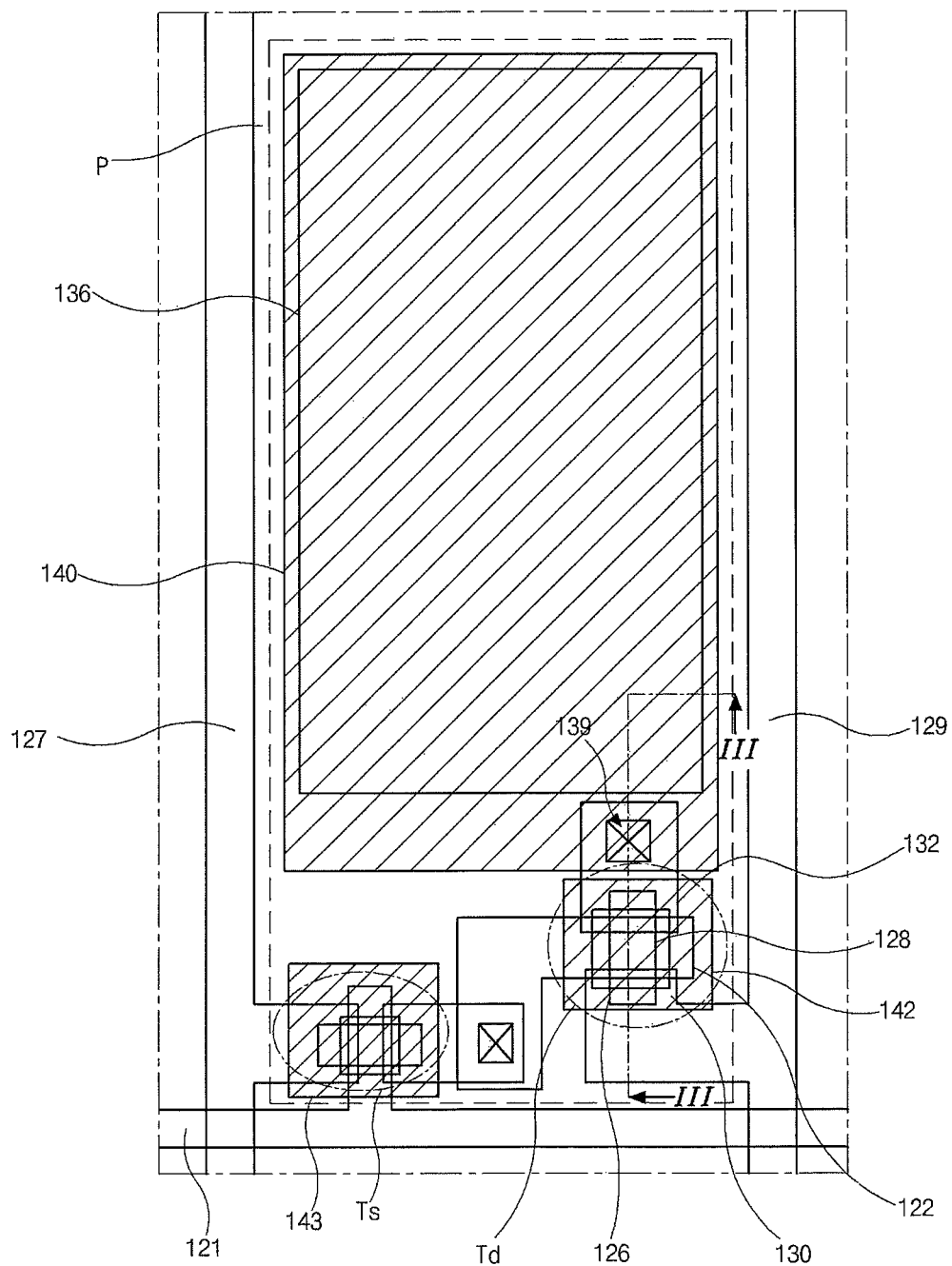
FIG. 2 is a plane view of an example of an OLED display device according to a first embodiment of the present invention.
Figure 3:
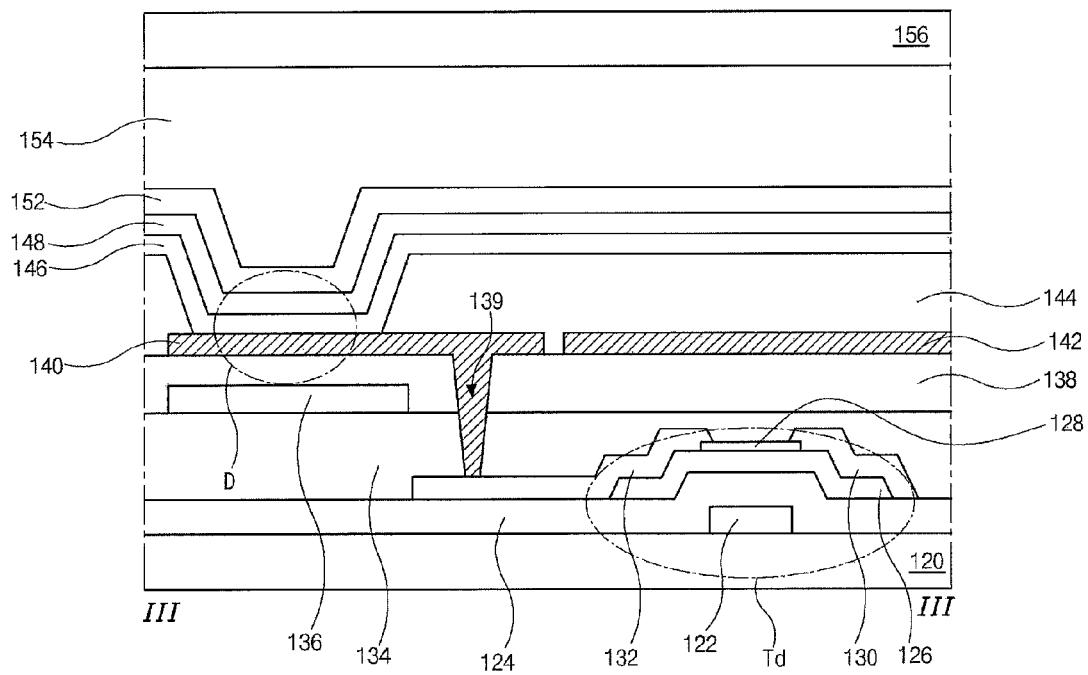
FIG. 3 is a cross-sectional view taken along the line of FIG. 2.

FIG. 2 is a plane view of an OLED display device according to a first embodiment of the present invention, and FIG. 3 is a cross-sectional view taken along the line of FIG. 2.

As shown in FIGS. 2 and 3, an example of an OLED display device 110 according to the first embodiment of the present invention includes first and second substrates 120 and 156, a driving TFT Td, a switching TFT Ts, an emitting diode D on the first substrate 120, and a seal layer 154 between the first and second substrates 120 and 156. The first and second substrates 120 and 156 face together and are separated from each other. The seal layer 154 covers an entire surface of the first and second substrates 120 and 156.

The first and second substrates 120 and 156, which face together and are separated from each other, include a plurality of pixel sub-regions in a pixel region P. The first substrate 120 may be referred to as a lower substrate, a TFT substrate or a backplane. The second substrate 156 may be referred to as an incapsulation substrate.

A gate line 121 and a gate electrode 122 are formed on the first substrate 120. A gate insulating layer 124 is formed on the gate line 121 and the gate electrode 122. An oxide semiconductor layer 126 corresponding to the gate electrode 122 is formed on the gate insulating layer 124, and an etch stopper 128 is formed on the oxide semiconductor layer 126. A source electrode 130 and a drain electrode 132 are formed at both ends of the etch stopper 128 and the oxide semiconductor layer 126. In addition, a data line 127 and a power line 129 are formed on the gate insulating layer 124, wherein the data line 127 crosses the gate line 121 to define the pixel region P. The source electrode 130 may be connected to the power line 129.

The gate electrode 122, the oxide semiconductor layer 126, the source electrode 130 and the drain electrode 132 constitute the driving TFT Td.

Similar to the driving TFT Td, the switching TFT Ts includes a gate electrode, an oxide semiconductor layer, a source electrode and a drain electrode. The gate electrode of the switching TFT Ts may be connected to the gate line 121. The source electrode of the switching TFT Ts may be connected to the data line 127, and the drain electrode of the switching TFT Ts may be connected to the gate electrode 122 of the driving TFT Td.

Each of the oxide semiconductor layer 126 of the driving TFT Td and the oxide semiconductor layer of the switching TFT Ts is formed of an oxide semiconductor material, e.g., indium-gallium-zinc-oxide (IGZO), zinc-indium-oxide (ZIO), zinc-gallium-oxide (ZGO) and zinc-tin-oxide (ZTO) which gives the driving TFT Td excellent electrical properties including high mobility, a low off-current and a uniform constant current.

A first passivation layer 134 is formed on the switching TFT Ts and the driving TFT Td, and a color filter layer 136 is formed on the first passivation layer 134 and in each of the pixel sub-regions in pixel region P. For example, the color filter layer 136 may include red, green and blue color filters in each of the pixel sub-regions in pixel region P, respectively.

A planarization layer 138 is formed on the color filter layer 136 to remove a step difference, and a drain contact hole 139 exposing the drain electrode 132 of the driving TFT Td is formed through the first passivation layer 134 and the planarization layer 138.

A first electrode 140 corresponding to the color filter layer 136 is formed on the planarization layer 138. The first electrode 140 is connected to the drain electrode 132 through the drain contact hole 139.

A first hydrogen blocking layer 142 corresponding to the driving TFT Td and a second hydrogen blocking layer 143 corresponding to the switching TFT Ts are formed on the planarization layer 138.

Diffusion of the hydrogen residues of a second passivation layer 152, which is formed in a below process, into the oxide semiconductor layer 126 of the driving TFT Td and the oxide semiconductor layer of the switching TFT Ts is prevented by the first and second hydrogen blocking layers 142 and 143.

For example, the first and second hydrogen blocking layers 142 and 143 may have an area being equal to or larger than the oxide semiconductor layer 126 of the driving TFT Td and the oxide semiconductor layer of the switching TFT Ts, respectively.

To efficiently prevent the diffusion of the hydrogen residues, each of the first and second hydrogen blocking layers 142 and 143 may be formed of an inorganic material, e.g., indium-tin-oxide (ITO), indium-zinc-oxide (IZO), molybdenum (Mo), molybdenum-titanium alloy (MoTi), copper (Cu), silver (Ag), gold (Au), Ti, zirconium (Zr), thorium (Th), vanadium (V), palladium (Pd), nickel (Ni), and tin (Sn).

When the first electrode 140 is formed of ITO or IZO, the first and second hydrogen blocking layers 142 and 143 may be formed of the same material and on the same layer as the first electrode 140. The first and second hydrogen blocking layers 142 and 143 may be spaced apart from the first electrode 140 to avoid a parasitic capacitance between each of the first and second hydrogen blocking layers 142 and 143 and each of the driving and switching TFTs Td and Ts. Alternatively, the first and second hydrogen blocking layers 142 and 143 may extend from the first electrode 140.

In this instance, since the first electrode 140 and the first and second hydrogen blocking layers 142 and 143 can be formed by a single mask process, the OLED display device does not need multiple fabrications processes for forming the first and second hydrogen blocking layers 142 and 143.

The first and second hydrogen blocking layers 142 and 143 may be formed by a chemical vapor deposition (CVD) method or a physical vapor deposition (PVD) method.

A bank 144 covering edges of the first electrode 140 is formed on the first electrode 140 and the first and second hydrogen blocking layers 142 and 143. In other words, the bank 144 includes an opening such that a center of the first electrode 140 is exposed.

An emitting layer 146, which contacts the first electrode 140 through the opening of the bank 144, is formed on the bank 144, and a second electrode 148 is formed on the emitting layer 146.

The first electrode 140, the emitting layer 146 and the second electrode 148 constitute the emitting diode D.

In addition, a second passivation layer 152 is formed on the emitting diode D.

The second passivation layer 152 may be a silicon nitride (SiNx) layer, a silicon oxide nitride (SiON) layer or a silicon oxide (SiOx) layer formed by a plasma chemical vapor deposition (PCVD) apparatus or a physical vapor deposition (PVD) apparatus such as a sputter.

The second passivation layer 152 is formed of silicon compound in the PCVD apparatus or the PVD apparatus under a low temperature (e.g., less than about 100° C.) to prevent thermal degradation of the emitting layer 146.

The seal layer 154 is formed on an entire surface of the second passivation layer 152 and the second substrate 156 such that the first and second substrates 120 and 156 are attached. Alternatively, the OLED has a top surface of the second passivation layer without the seal layer and the second substrate.

In the OLED display device according to related art, damages on the emitting diode D resulting from an impact of outer moisture and particles is prevented by the second passivation layer 152. As described above, the second passivation layer 152 is formed over an entire surface of the first substrate 120 and the second passivation layer 52 covers the pixel region P.

In addition, due to the first and second hydrogen blocking layers 142 and 143 covering the oxide semiconductor layer 126 of the driving TFT Td and the oxide semiconductor layer of the switching TFT Ts, respectively, the diffusion of the hydrogen residues of the second passivation layer 152 into the oxide semiconductor layer 126 of the driving TFT Td and the oxide semiconductor layer of the switching TFT Ts is prevented.

On the other hand, the hydrogen blocking degree of the inorganic material of the first and second hydrogen blocking layers 142 and 143 depends on hydrogen solubility of the inorganic material of the first and second hydrogen blocking layers 142 and 143.

Figure 4:
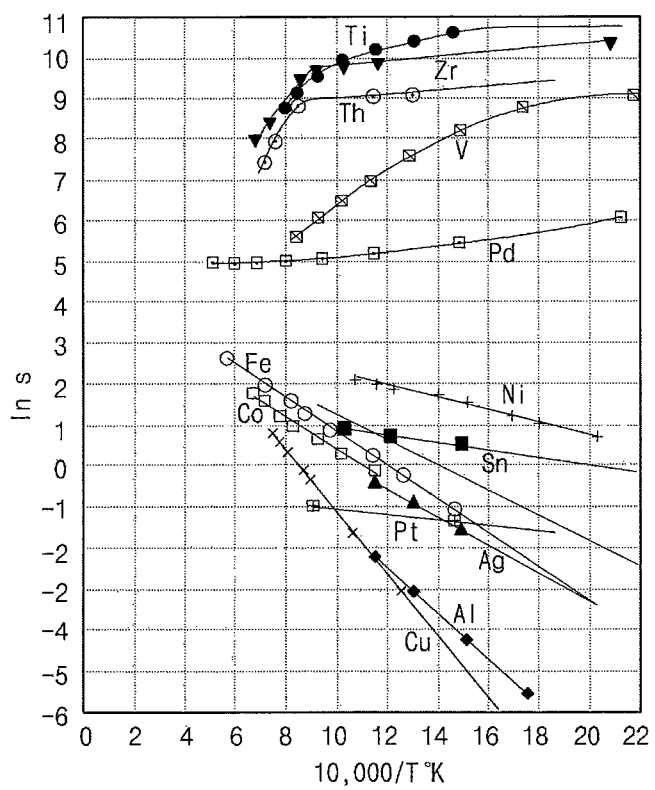
FIG. 4 is a graph showing hydrogen solubility according to an example of a material of a hydrogen blocking layer for an OLED display device of the present invention.

Referring to FIG. 4, which is a graph showing hydrogen solubility according to a material of a hydrogen blocking layer for an OLED display device of the present invention, Ti, Zr, Th, V, Pd, Ni and Sn have a relatively high hydrogen solubility, while Au, Ag, aluminum (Al), Pt and Cu have a relatively low hydrogen solubility. Considering hydrogen solubility, an adhesive property, an anti-oxidation property and a process temperature, the first and second hydrogen blocking layers 142 and 143 may be formed of one of Ti, Zr, Th, V, Pd, Ni and Sn. In addition, since the alloy of the above high hydrogen solubility inorganic material, i.e., Ti, Zr, Th, V, Pd, Ni and Sn, has a relatively low melting temperature, there is an advantage in a process temperature when the first and second hydrogen blocking layers 142 and 143 are formed of the alloy of the above high hydrogen solubility inorganic material.

In the above-mentioned OLED display device 110 according to the first embodiment of the present invention, since the diffusion of the hydrogen residues of the second passivation layer 152 into the oxide semiconductor layer 126 of the driving TFT Td and the oxide semiconductor layer of the switching TFT Ts is prevented by the first and second hydrogen blocking layers 142 and 143, which are respectively positioned between the second passivation layer 152 and each of the oxide semiconductor layer 126 of the driving TFT Td and the oxide semiconductor layer of the switching TFT Ts, the reduction of the oxide semiconductor layer 126 of the driving TFT Td and the oxide semiconductor layer of the switching TFT Ts is prevented. As a result, defects such as brightness differences in images for the OLED display device are prevented, and a displaying quality of the OLED display device is improved.

In the above-mentioned OLED display device, since the emitting layer 146 emits white light such that the color filter layer 136 is formed to provide color images. Alternatively, the emitting layers in the pixel sub-regions may emit red light, green light and blue light. In this instance, the color filter layer 136 and the planarization layer 138 may be omitted.

In addition, in the above-mentioned OLED display device, the first and second substrates 120 and 156 are attached by the seal layer 154. Alternatively, the first and second substrates may be attached by a seal pattern formed at edges of the first and second substrates.

Figure 5:
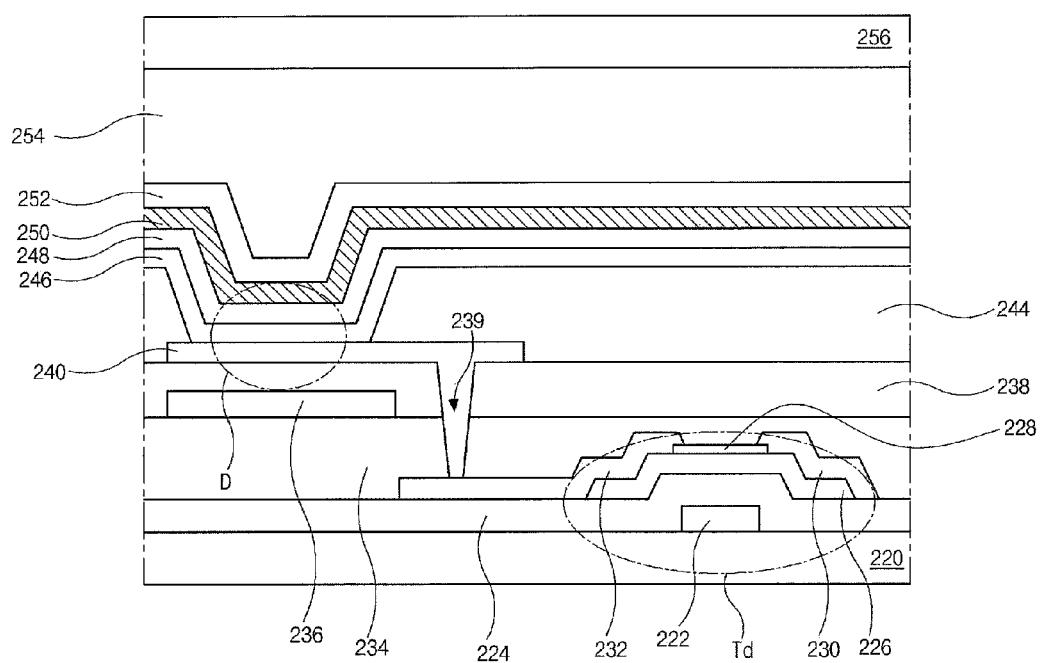
FIG. 5 is a cross-sectional view of an example of an OLED display device according to a second embodiment of the present invention.

FIG. 5 is a plane view of an example of an OLED display device according to a second embodiment of the present invention.

As shown in FIG. 5, an OLED display device 210 according to the second embodiment of the present invention includes first and second substrates 220 and 256, a driving TFT Td, a switching TFT and an emitting diode D on the first substrate 220, and a seal layer 254 covering an entire surface between the first and second substrates 220 and 256.

The first and second substrates 220 and 256, which face and are separated from each other, include a plurality of pixel sub-regions in a pixel region. The first substrate 220 may be referred to as a lower substrate, a TFT substrate or a backplane. The second substrate 256 may be referred to as an incapsulation substrate.

A gate line (refer to FIG. 2) and a gate electrode 222 are formed on the first substrate 220, and a gate insulating layer 224 is formed on the gate line and the gate electrode 222. An oxide semiconductor layer 226 corresponding to the gate electrode 222 is formed on the gate insulating layer 224, and an etch stopper 228 is formed on the oxide semiconductor layer 226. A source electrode 230 and a drain electrode 232 are formed at both ends of the etch stopper 228 and the oxide semiconductor layer 226. In addition, a data line (refer to FIG. 2), which crosses the gate line to define the pixel region, and a power line (refer to FIG. 2) are formed on the gate insulating layer 224. The source electrode 230 may be connected to the power line.

The gate electrode 222, the oxide semiconductor layer 226, the source electrode 230 and the drain electrode 232 constitute the driving TFT Td.

Similar to the driving TFT Td, the switching TFT includes a gate electrode, an oxide semiconductor layer, a source electrode and a drain electrode. The gate electrode of the switching TFT may be connected to the gate line. The source electrode of the switching TFT may be connected to the data line, and the drain electrode of the switching TFT may be connected to the gate electrode 222 of the driving TFT Td.

Each of the oxide semiconductor layer 226 of the driving TFT Td and the oxide semiconductor layer of the switching TFT is formed of an oxide semiconductor material, e.g., indium-gallium-zinc-oxide (IGZO), zinc-indium-oxide (ZIO), zinc-gallium-oxide (ZGO) and zinc-tin-oxide (ZTO) which gives the driving TFT Td excellent electrical properties including high mobility, a low off-current and a uniform constant current.

A first passivation layer 234 is formed on the switching TFT and the driving TFT Td, and a color filter layer 236 is formed on the first passivation layer 234 and in of the pixel sub-regions. For example, the color filter layer 236 may include red, green and blue color filters in the pixel sub-regions, respectively.

A planarization layer 238 is formed on the color filter layer 236 to remove a step difference, and a drain contact hole 239 exposing the drain electrode 232 of the driving TFT Td is formed through the first passivation layer 234 and the planarization layer 238.

A first electrode 240 corresponding to the color filter layer 236 is formed on the planarization layer 238. The first electrode 240 is connected to the drain electrode 232 through the drain contact hole 239.

A bank 244 covering edges of the first electrode 240 is formed on the first electrode 240. In other words, the bank 244 includes an opening such that a center of the first electrode 240 is exposed.

An emitting layer 246, which contacts the first electrode 240 through the opening of the bank 244, is formed on the bank 244, and a second electrode 248 is formed on the emitting layer 146.

The first electrode 240, the emitting layer 246 and the second electrode 248 constitute the emitting diode D.

A hydrogen blocking layer 250 is formed on the second electrode 248 of the emitting diode D.

Diffusion of the hydrogen residues of a second passivation layer 252, which is formed in a below process, into the oxide semiconductor layer 226 of the driving TFT Td and the oxide semiconductor layer of the switching TFT is prevented by the hydrogen blocking layer 250.

For example, the blocking layer 250 may be formed over an entire surface of the first substrate 220 to cover the oxide semiconductor layer of the switching TFT and the oxide semiconductor layer 226 of the driving TFT Td. Alternatively, the blocking layer 250 may have an island shape corresponding to the oxide semiconductor layer of the switching TFT and the oxide semiconductor layer 226 of the driving TFT Td.

To efficiently prevent the diffusion of the hydrogen residues, the hydrogen blocking layer 250 may be formed of an inorganic material, e.g., indium-tin-oxide (ITO), indium-zinc-oxide (IZO), molybdenum (Mo), molybdenum-titanium alloy (MoTi), copper (Cu), silver (Ag), gold (Au), Ti, zirconium (Zr), thorium (Th), vanadium (V), palladium (Pd), nickel (Ni), and tin (Sn).

The hydrogen blocking layer 250 may be formed by a chemical vapor deposition (CVD) method or a physical vapor deposition (PVD) method.

A second passivation layer 252 is formed on the hydrogen blocking layer 250. The seal layer 254 is formed on an entire surface of the second passivation layer 252 and the second substrate 256 such that the first and second substrates 220 and 256 are attached.

In the above-mentioned OLED display device 210 according to the second embodiment of the present invention, since the diffusion of the hydrogen residues of the second passivation layer 252 into the oxide semiconductor layer 226 of the driving TFT Td and the oxide semiconductor layer of the switching TFT is prevented by the hydrogen blocking layer 250, which is positioned between the second passivation layer 252 and each of the oxide semiconductor layer 226 of the driving TFT Td and the oxide semiconductor layer of the switching TFT, the reduction of the oxide semiconductor layer 226 of the driving TFT Td and the oxide semiconductor layer of the switching TFT is prevented. As a result, defects such as brightness differences in images for the OLED display device are prevented, and a displaying quality of the OLED display device is improved.

In the above-mentioned OLED display device, the emitting layer 246 emits white light to form the color filter layer 236 to provide color images. Alternatively, the emitting layers in the pixel sub-regions may emit red light, green light and blue light. In this instance, the color filter layer 236 and the planarization layer 238 may be omitted.

In addition, in the above-mentioned OLED display device, the first and second substrates 220 and 256 are attached by the seal layer 254. Alternatively, the first and second substrates may be attached by a seal pattern formed at edges of the first and second substrates.

On the other hand, the blocking layer may have an island shape corresponding to the oxide semiconductor layer of the switching TFT and the oxide semiconductor layer of the driving TFT. This structure will be explained with reference to FIG. 6.

Figure 6:
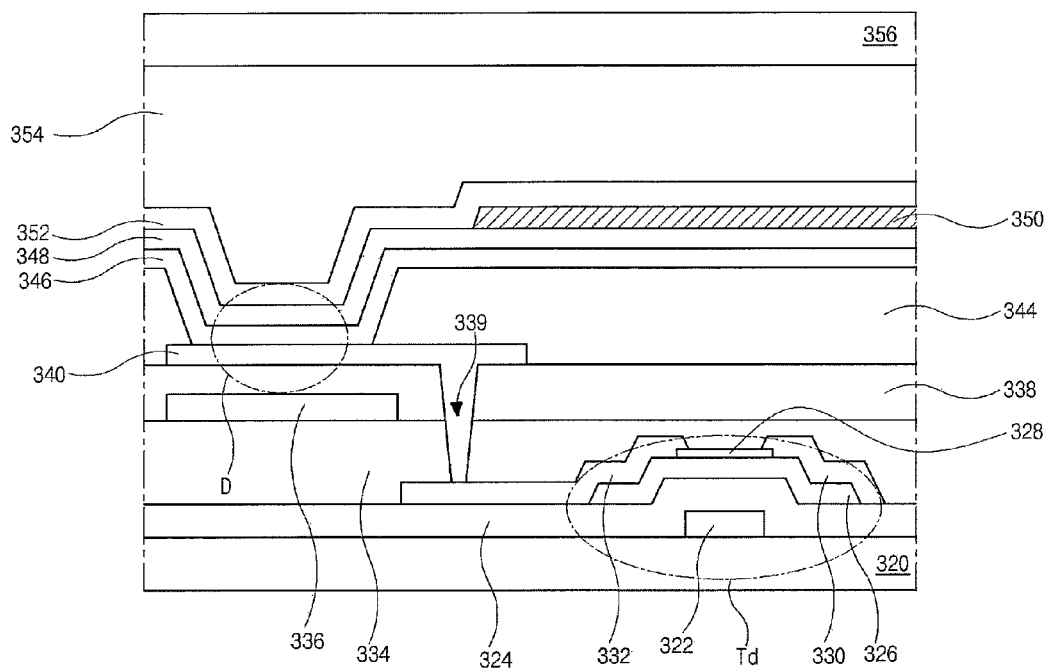
FIG. 6 is a cross-sectional view of an example of an OLED display device according to a third embodiment of the present invention.

FIG. 6 is a plane view of an example of an OLED display device according to a third embodiment of the present invention.

As shown in FIG. 6, an OLED display device 310 according to the third embodiment of the present invention includes first and second substrates 320 and 356, a driving TFT Td, a switching TFT and an emitting diode D on the first substrate 320, and a seal layer 354 covering an entire surface between the first and second substrates 320 and 356.

The switching TFT, the driving TFT and the emitting diode D have substantially the same structures as those of the OLED display device according to the second embodiment of the present invention. Explanation to the switching TFT, the driving TFT and the emitting diode D is omitted.

A hydrogen blocking layer 350 is formed on the second electrode 348 of the emitting diode D. Namely, different from the hydrogen blocking layer 250 (refer to FIG. 5), the hydrogen blocking layer 350 has an island shape to completely cover the oxide semiconductor layer of the switching TFT and the oxide semiconductor layer 326 of the driving TFT Td.

Diffusion of the hydrogen residues of a second passivation layer 352, which is formed in a below process, into the oxide semiconductor layer 326 of the driving TFT Td and the oxide semiconductor layer of the switching TFT is prevented by the hydrogen blocking layer 350.

To efficiently prevent the diffusion of the hydrogen residues, the hydrogen blocking layer 350 may be formed of an inorganic material, e.g., indium-tin-oxide (ITO), indium-zinc-oxide (IZO), molybdenum (Mo), molybdenum-titanium alloy (MoTi), copper (Cu), silver (Ag), gold (Au), Ti, zirconium (Zr), thorium (Th), vanadium (V), palladium (Pd), nickel (Ni), and tin (Sn).

The hydrogen blocking layer 350 may be formed by a chemical vapor deposition (CVD) method or a physical vapor deposition (PVD) method.

The second passivation layer 352 and the seal layer 354 over the hydrogen blocking layer 350 have substantially the same structures as those of the OLED display device according to the second embodiment of the present invention. Explanation to the second passivation layer 352 and the seal layer 354 is omitted.

In the above-mentioned OLED display device 310 according to the third embodiment of the present invention, since the diffusion of the hydrogen residues of the second passivation layer 352 into the oxide semiconductor layer 326 of the driving TFT Td and the oxide semiconductor layer of the switching TFT is prevented by the hydrogen blocking layer 350, which is positioned between the second passivation layer 352 and each of the oxide semiconductor layer 326 of the driving TFT Td and the oxide semiconductor layer of the switching TFT, the reduction of the oxide semiconductor layer 326 of the driving TFT Td and the oxide semiconductor layer of the switching TFT is prevented. As a result, defects such as brightness differences in images for the OLED display device are prevented, and a displaying quality of the OLED display device is improved.

In addition, since the hydrogen blocking layer 350 has an island shape to completely cover the oxide semiconductor layer of the switching TFT and the oxide semiconductor layer 326 of the driving TFT Td, the OLED display device 310 in a top emission type has an improved brightness because the blocking layer 350 is not cover the second electrode 348 corresponding to the emitting layer 346.

Alternatively, the hydrogen blocking layer may be positioned between the first passivation layer and the planarization layer. This structure will be explained with reference to FIG. 7.

Figure 7:
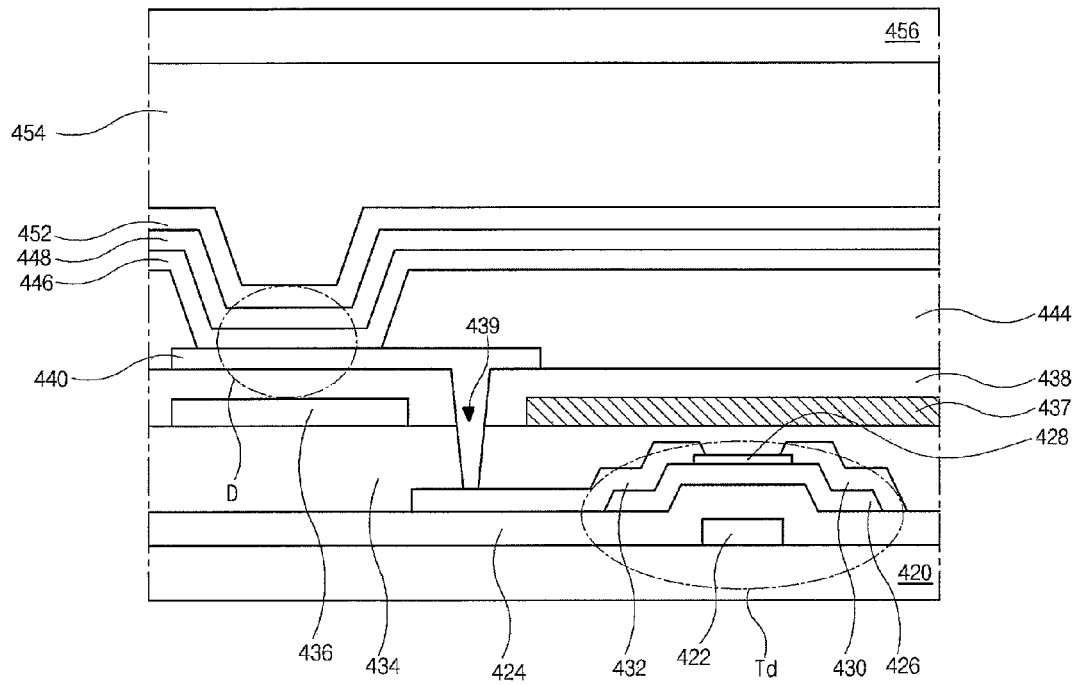
FIG. 7 is a cross-sectional view of an example of an OLED display device according to a fourth embodiment of the present invention.

FIG. 7 is a plane view of an example of an OLED display device according to a fourth embodiment of the present invention. The explanation is focused on difference with other embodiments.

As shown in FIG. 7, an OLED display device 410 according to the fourth embodiment of the present invention includes first and second substrates 420 and 456, a driving TFT Td, a switching TFT and an emitting diode D on the first substrate 420, and a seal layer 454 covering an entire surface between the first and second substrates 420 and 456.

The switching TFT, the driving TFT and the emitting diode D have substantially the same structures as those of the OLED display device according to the first embodiment of the present invention. Explanation to the switching TFT, the driving TFT and the emitting diode D is omitted.

A first passivation layer 434 is formed on the switching TFT and the driving TFT Td, and a color filter layer 436 is formed on the first passivation layer 434 and in each of the pixel sub-regions. For example, the color filter layer 436 may include red, green and blue color filters in each of the pixel sub-regions, respectively.

A hydrogen blocking layer 437 corresponding to the switching TFT and the driving TFT Td is formed on the first passivation layer 434. The hydrogen blocking layer 437 has an island shape to completely cover the oxide semiconductor layer of the switching TFT and the oxide semiconductor layer 426 of the driving TFT Td.

Diffusion of the hydrogen residues of a second passivation layer 452, which is formed in a below process, into the oxide semiconductor layer 426 of the driving TFT Td and the oxide semiconductor layer of the switching TFT Ts is prevented by the hydrogen blocking layer 437.

To efficiently prevent the diffusion of the hydrogen residues, the hydrogen blocking layer 437 may be formed of an inorganic material, e.g., indium-tin-oxide (ITO), indium-zinc-oxide (IZO), molybdenum (Mo), molybdenum-titanium alloy (MoTi), copper (Cu), silver (Ag), gold (Au), Ti, zirconium (Zr), thorium (Th), vanadium (V), palladium (Pd), nickel (Ni), and tin (Sn).

The hydrogen blocking layer 437 may be formed by a chemical vapor deposition (CVD) method or a physical vapor deposition (PVD) method.

A planarization layer 438 is formed on the color filter layer 436 and the hydrogen blocking layer 437 to remove a step difference, and a drain contact hole 439 exposing the drain electrode 432 of the driving TFT Td is formed through the first passivation layer 434 and the planarization layer 438.

In the above-mentioned OLED display device 410 according to the second embodiment of the present invention, since the diffusion of the hydrogen residues of the second passivation layer 452 into the oxide semiconductor layer 426 of the driving TFT Td and the oxide semiconductor layer of the switching TFT is prevented by the hydrogen blocking layer 437, which is positioned between the second passivation layer 452 and each of the oxide semiconductor layer 426 of the driving TFT Td and the oxide semiconductor layer of the switching TFT, the reduction of the oxide semiconductor layer 426 of the driving TFT Td and the oxide semiconductor layer of the switching TFT is prevented. As a result, defects such as brightness differences in images for the OLED display device are prevented, and a displaying quality of the OLED display device is improved.

Figure 8:
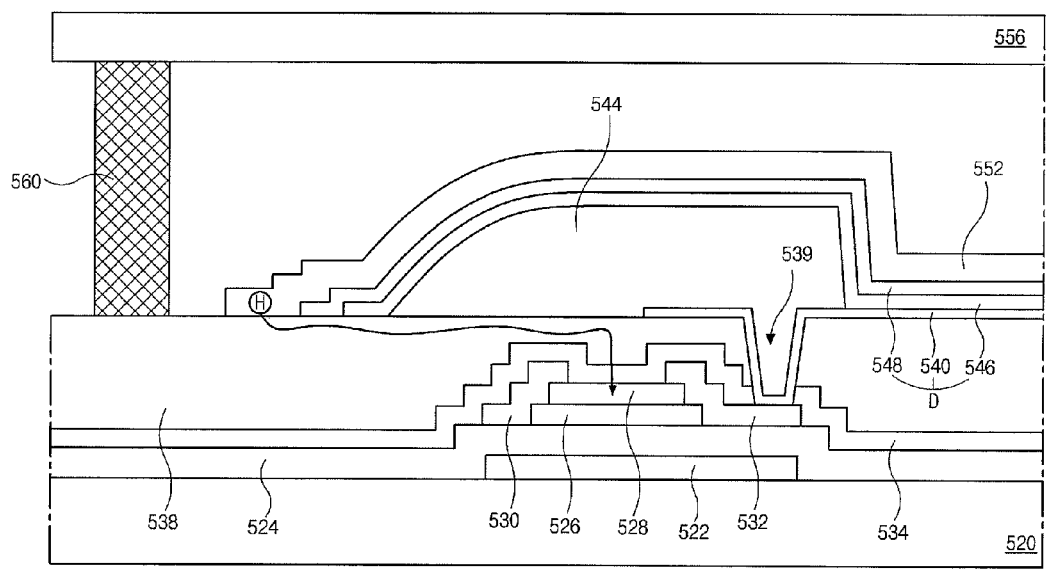
FIG. 8 is a cross-sectional view showing an example of an edge of an OLED display device.

On the other hand, referring to FIG. 8, which is a cross-sectional view showing an example of an edge of an OLED display device, wherein hydrogen diffusion is generated at an edge of the OLED display device such that a brightness difference problem is generated in the pixel regions along the edge of the OLED display device.

In more detail, for example, an OLED display device 510 includes first and second substrates 520 and 556, a driving TFT Td, a switching TFT (refer to FIG. 2) and an emitting diode D on the first substrate 520, and a seal pattern 560 at edges between the first and second substrates 520 and 556.

The first and second substrates 520 and 556, which face together and are separated from each other, include a plurality of pixel sub-regions in a pixel region (refer to FIG. 5). The first substrate 520 may be referred to as a lower substrate, a TFT substrate or a backplane. The second substrate 556 may be referred to as an incapsulation substrate.

A gate line (refer to FIG. 2) and a gate electrode 522 are formed on the first substrate 520, and a gate insulating layer 524 is formed on the gate line and the gate electrode 522. An oxide semiconductor layer 526 corresponding to the gate electrode 522 is formed on the gate insulating layer 524, and an etch stopper 528 is formed on the oxide semiconductor layer 526. A source electrode 530 and a drain electrode 532 are formed at both ends of the etch stopper 528 and the oxide semiconductor layer 526. In addition, a data line (refer to FIG. 2), which crosses the gate line to define the pixel region, and a power line (refer to FIG. 2) are formed on the gate insulating layer 524. The source electrode 530 may be connected to the power line.

The gate electrode 522, the oxide semiconductor layer 526, the source electrode 530 and the drain electrode 532 constitute the driving TFT Td.

Similar to the driving TFT Td, the switching TFT includes a gate electrode, an oxide semiconductor layer, a source electrode and a drain electrode. The gate electrode of the switching TFT may be connected to the gate line. The source electrode of the switching TFT may be connected to the data line, and the drain electrode of the switching TFT may be connected to the gate electrode 522 of the driving TFT Td.

Each of the oxide semiconductor layer 526 of the driving TFT Td and the oxide semiconductor layer of the switching TFT is formed of an oxide semiconductor material, e.g., indium-gallium-zinc-oxide (IGZO), zinc-indium-oxide (ZIO), zinc-gallium-oxide (ZGO) and zinc-tin-oxide (ZTO) such that the driving TFT Td has excellent electrical properties of a high mobility, low off-current and uniform constant current.

A first passivation layer 534 is formed on the switching TFT and the driving TFT Td. Although not shown, a color filter layer is formed on the first passivation layer 534 and in each pixel region. For example, the color filter layer may include red, green and blue color filters in the pixel regions, respectively.

A planarization layer 538 is formed on the first passivation layer 534 to remove a step difference, and a drain contact hole 539 exposing the drain electrode 532 of the driving TFT Td is formed through the first passivation layer 534 and the planarization layer 538.

A first electrode 540 corresponding to the pixel region is formed on the planarization layer 538. The first electrode 540 is connected to the drain electrode 532 through the drain contact hole 539.

A bank 544 covering edges of the first electrode 540 is formed on the first electrode 540. In other words, the bank 544 includes an opening such that a center of the first electrode 540 is exposed.

An emitting layer 546, which contacts the first electrode 540 through the opening of the bank 544, is formed on the bank 544, and a second electrode 548 is formed on the emitting layer 546.

The first electrode 540, the emitting layer 546 and the second electrode 548 constitute the emitting diode D.

A second passivation layer 552 is formed on the second electrode 548. The seal pattern 560 is formed at the edge between the first and second substrates 520 and 556 to seal a space between the first and second substrates 520 and 556.

In the above OLED display device 510, the second passivation layer 552 should completely cover the second electrode 548 to avoid an erosion problem of the second electrode 548. Namely, the second passivation layer 552 should have an area larger than the second electrode 548. If the second electrode 548 is incompletely covered by the second passivation layer 552, the second electrode 548 is exposed to moistures which pass through the seal pattern 560. As a result, the second electrode 548 is eroded.

On the other hand, in the above OLED display device 510, the hydrogen residue in the second passivation layer 552 is diffused through the planarization layer 538 and the first passivation layer 534. As a result, the hydrogen residue is diffused into the oxide semiconductor layer 526 such that properties of the TFT is degraded and brightness difference in an image are generated. Particularly, the second passivation layer 552 contacts the planarization layer 538 with the second electrode 548 in edges of a display region, the above problems can frequently be generated in the edges of the OLED display device.

An OLED display device, which can prevent the above problems, is explained.

Figure 9:
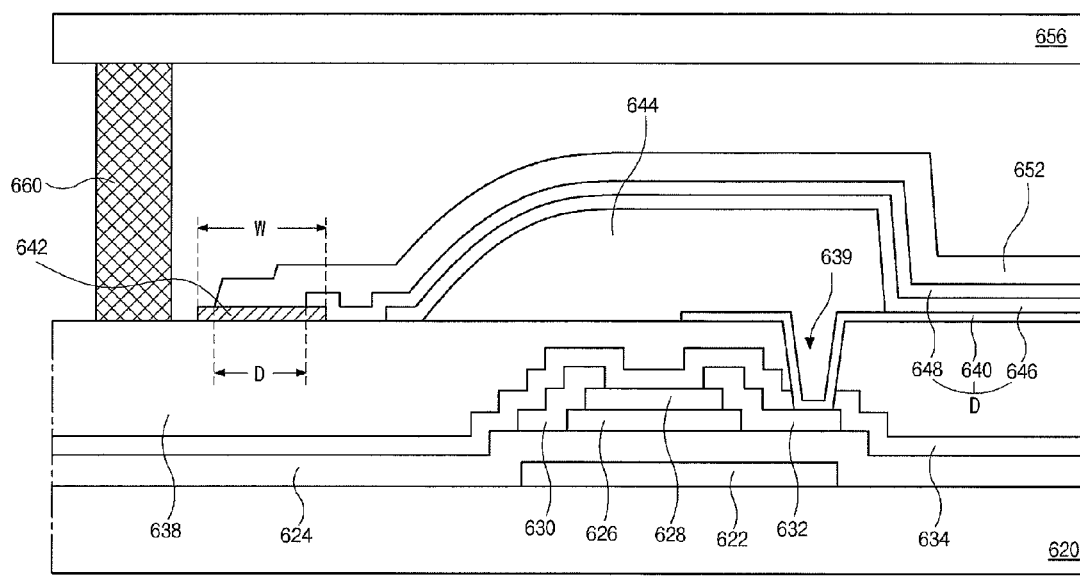
FIG. 9 is a cross-section view of an example of an OLED display device according to a fifth embodiment of the present invention.
Figure 10:
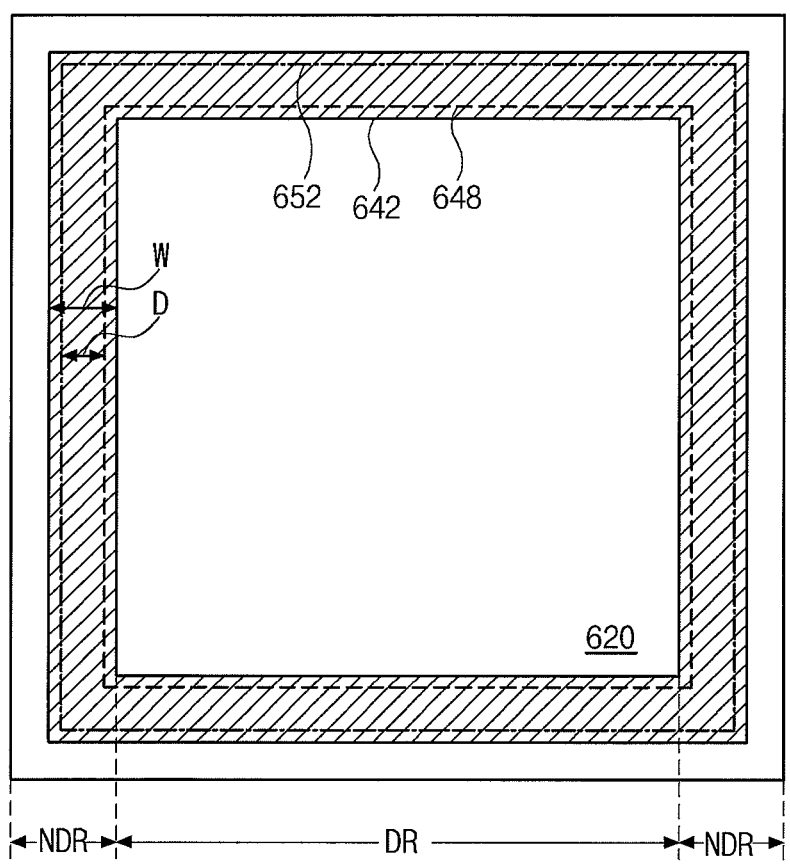
FIG. 10 is a plane view of the OLED display device according to the fifth embodiment of the present invention.

FIG. 9 is a cross-section view of an OLED display device according to a fifth embodiment of the present invention. FIG. 10 is a plane view of an OLED display device according to a fifth embodiment of the present invention.

As shown in FIG. 9, an OLED display device 610 includes first and second substrates 620 and 656, a driving TFT Td, a switching TFT (not shown) and an emitting diode D on the first substrate 620, and a seal pattern 660 at edges between the first and second substrates 620 and 656.

The first and second substrates 620 and 656, which face and are separated from each other, include a plurality of pixel regions (not shown). The first substrate 620 includes a display region DR and a non-display region NDR. The plurality of pixel regions are disposed in the display region DR. The first substrate 620 may be referred to as a lower substrate, a TFT substrate or a backplane. The second substrate 656 may be referred to as an incapsulation substrate.

A gate line (refer to FIG. 2) and a gate electrode 622 are formed on the first substrate 620, and a gate insulating layer 624 is formed on the gate line and the gate electrode 622. An oxide semiconductor layer 626 corresponding to the gate electrode 622 is formed on the gate insulating layer 624, and an etch stopper 628 is formed on the oxide semiconductor layer 626. A source electrode 630 and a drain electrode 632 are formed at both ends of the etch stopper 628 and the oxide semiconductor layer 626. In addition, a data line (refer to FIG. 2), which crosses the gate line to define the pixel region, and a power line (refer to FIG. 2) are formed on the gate insulating layer 624. The source electrode 630 may be connected to the power line.

The gate electrode 622, the oxide semiconductor layer 626, the source electrode 630 and the drain electrode 632 constitute the driving TFT Td.

Similar to the driving TFT Td, the switching TFT includes a gate electrode, an oxide semiconductor layer, a source electrode and a drain electrode. The gate electrode of the switching TFT may be connected to the gate line. The source electrode of the switching TFT may be connected to the data line, and the drain electrode of the switching TFT may be connected to the gate electrode 622 of the driving TFT Td.

Each of the oxide semiconductor layer 626 of the driving TFT Td and the oxide semiconductor layer of the switching TFT is formed of an oxide semiconductor material, e.g., indium-gallium-zinc-oxide (IGZO), zinc-indium-oxide (ZIO), zinc-gallium-oxide (ZGO) and zinc-tin-oxide (ZTO) such that the driving TFT Td has excellent electrical properties of a high mobility, low off-current and uniform constant current.

A first passivation layer 634 is formed on the switching TFT and the driving TFT Td. Although not shown, a color filter layer is formed on the first passivation layer 634 and in each pixel region. For example, the color filter layer may include red, green and blue color filters in the pixel regions, respectively.

A planarization layer 638 is formed on the first passivation layer 634 to remove a step difference, and a drain contact hole 639 exposing the drain electrode 632 of the driving TFT Td is formed through the first passivation layer 634 and the planarization layer 638.

A first electrode 640 corresponding to the pixel region is formed on the planarization layer 638. The first electrode 640 may be formed of indium-tin-oxide (ITO), indium-gallium-zinc-oxide (IGZO), indium-zinc-oxide (IZO). The first electrode 640 is connected to the drain electrode 632 through the drain contact hole 639.

A bank 644 covering edges of the first electrode 640 is formed on the first electrode 640. In other words, the bank 644 includes an opening such that a center of the first electrode 640 is exposed.

An emitting layer 646, which contacts the first electrode 640 through the opening of the bank 644, is formed on the bank 644, and a second electrode 648 is formed on the emitting layer 646. The second electrode 648 may be formed of aluminum (Al) or Al alloy.

The first electrode 640, the emitting layer 646 and the second electrode 648 constitute the emitting diode D.

A second passivation layer 652 is formed on the second electrode 648. The second passivation layer 652 completely covers the second electrode 648 to avoid an erosion problem of the second electrode 648.

In addition, a hydrogen blocking layer 642 is formed between the second passivation layer 652 and the planarization layer 638 to prevent the hydrogen diffusion from the second passivation layer 652 into the oxide semiconductor layer 626.

Referring to FIG. 10 with FIG. 9, the hydrogen blocking layer 642 with a width W may surround the display region DR of the OLED display device.

As explained above, the second passivation layer 652 should completely cover the second electrode 648. Namely, an end of the second passivation layer 652 should be spaced apart from an end of the second electrode 648 by a distance D.

The hydrogen blocking layer 642 has the width W being equal to or larger than the distance D between the end of the second passivation layer 652 and the end of the second electrode 648 and completely overlaps a space between the end of the second passivation layer 652 and the end of the second electrode 648. In other words, one end of the hydrogen blocking layer 642 is protruded from the end of the second passivation layer 652, and the other end of the hydrogen blocking layer 642 covers the end of the second electrode 648 or is covered by the end of the second electrode 648. As a result, the second passivation layer 652 does not contact the planarization layer 638 such that diffusion of hydrogen residue in the second passivation layer 652 into the oxide semiconductor layer 626 through the planarization layer 638 and the first passivation layer 634 is sufficiently prevented.

The hydrogen blocking layer 642 is disposed between the end of the second passivation layer 652 and the end of the second electrode 648 to cover the planarization layer 638 exposed between the second passivation layer 652 and the second electrode 648.

The hydrogen blocking layer 642 includes one of a metal, a metal alloy, and an oxide of the metal alloy. For example, the hydrogen blocking layer 642 may be formed of one of indium-tin-oxide (ITO), indium-gallium-zinc-oxide (IGZO), indium-zinc-oxide (IZO), molybdenum (Mo), molybdenum-titanium alloy (MoTi), copper (Cu), silver (Ag), gold (Au), Ti, zirconium (Zr), thorium (Th), vanadium (V), palladium (Pd), nickel (Ni), and tin (Sn).

In FIG. 9, the hydrogen blocking layer 642 is disposed between the second electrode 648 and the planarization layer 638. In this instance, the hydrogen blocking layer 642 may be formed at the same layer and of the same material as the first electrode 640 by a single mask process. The hydrogen blocking layer 642 and the first electrode 640 may be formed of ITO, IGZO or IZO.

A portion of an upper surface of the hydrogen blocking layer 642 contacts the second passivation layer 652, and an entire of a lower surface of the hydrogen blocking layer 642 contacts the planarization layer 638. In this instance, a contact area of the hydrogen blocking layer 642 and the planarization layer 638 is larger than a contact area of the hydrogen blocking layer 638 and the second passivation layer 652.

Alternatively, the hydrogen blocking layer 642 may be disposed between second electrode 648 and the second passivation layer 652 such that an end of the hydrogen blocking layer 642 covers an end of the second electrode 648.

Figure 1:
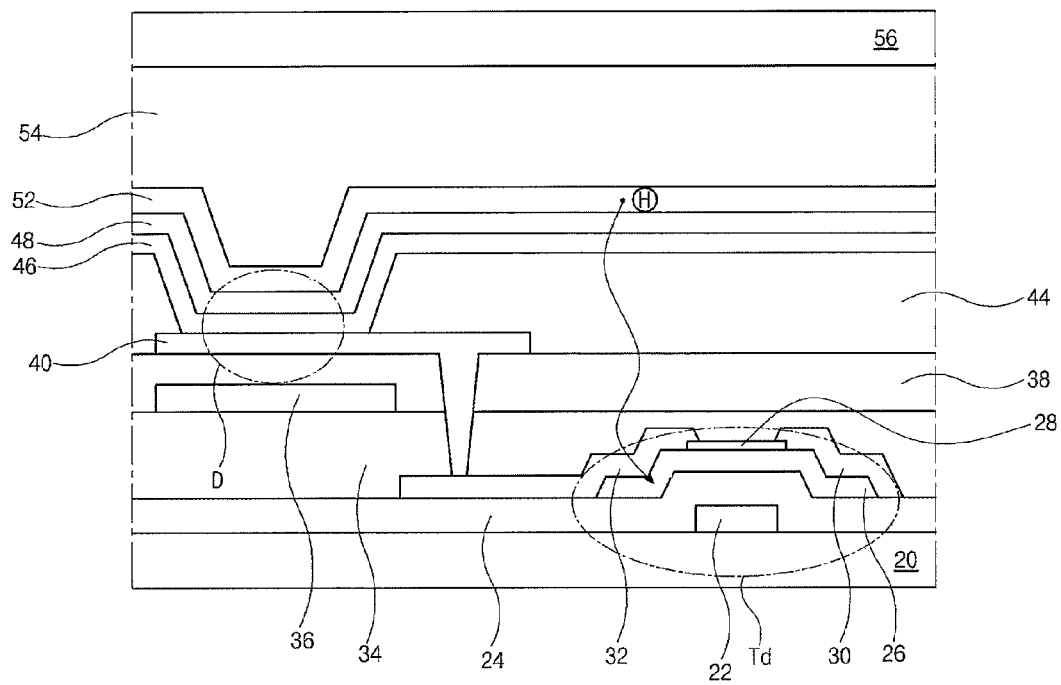
FIG. 1 is a cross-sectional view of an OLED display device according to related art.

The seal pattern 660 is formed at the edge between the first and second substrates 620 and 656 to seal a space between the first and second substrates 620 and 656. Alternatively, instead of the seal pattern 660, a seal layer 154 (refer to FIG. 1) is formed between the second substrate 656 and the second passivation layer 652.

A method of fabricating the OLED is briefly explained with reference to FIG. 9.

The gate line (refer to FIG. 2) and the gate electrode 622 are formed on the first substrate 620. The gate insulating layer 624 is formed on the gate line and the gate electrode 622.

Next, the oxide semiconductor layer 626 corresponding to the gate electrode 622 is formed on the gate insulating layer 624.

Next, the etch stopper 628 for protecting the oxide semiconductor layer 626 is formed on the oxide semiconductor layer 626.

Next, the source electrode 630, the drain electrode 632, the data line (refer to FIG. 2), the power line (refer to FIG. 2) are formed. The source electrode 630 and the drain electrode 632 are formed at both ends of the etch stopper 628 and the oxide semiconductor layer 626. The data line crosses the gate line to define the pixel region. The source electrode 630 may be connected to the power line and spaced apart from the drain electrode 632.

Next, the first passivation layer 634 is formed on the driving TFT Td.

Next, the planarization layer 638 is formed on the first passivation layer 634. The planarization layer 638 and the first passivation layer 634 are patterned to form the drain contact hole 639 exposing the drain electrode 632 of the driving TFT Td.

Next, the first electrode 640 corresponding to the pixel region is formed on the planarization layer 638. In addition, the hydrogen blocking layer 642 may be formed on the planarization layer 638. The hydrogen blocking layer 642 may be formed on the same layer and of the same material as the first electrode 640. In this instance, the hydrogen blocking layer 642 and the first electrode 640 may be simultaneously formed.

Next, the bank 644 covering edges of the first electrode 640 is formed on the first electrode 640.

Next, the emitting layer 646, which contacts the first electrode 640 through the opening of the bank 644, is formed on the bank 644.

Next, the second electrode 648 is formed on the emitting layer 646.

Next, the second passivation layer 652 is formed on the second electrode 648. If the hydrogen blocking layer 642 is not formed on the planarization layer 638, the hydrogen blocking layer 642 is formed after forming the second electrode 648 and before forming the second passivation layer 652.

Next, the seal pattern 660 is formed at the edge of one of the first and second substrates 620 and 656, and the first and second substrates 620 and 66 are attached.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
   a first substrate;
   an oxide semiconductor layer over the first substrate;
   a planarization layer over the oxide semiconductor layer;
   an emitting diode over the planarization layer;
   a passivation layer over the emitting diode;
   a second substrate on the passivation layer; and
   a hydrogen blocking layer between the planarization layer and the passivation layer to block hydrogen diffusion from the passivation layer to the oxide semiconductor layer.

2. The device according to claim 1, further comprising:
   a gate line, a data line, and a power line on the substrate, the gate and data lines crossing each other to define a pixel region; and
   a thin film transistor in the pixel region,
   wherein the thin film transistor includes the oxide semiconductor layer of an oxide semiconductor material, and
   wherein the hydrogen blocking layer has an area that is larger than an area of the oxide semiconductor layer.

3. The device according to claim 2, wherein the oxide semiconductor layer includes one of indium-gallium-zinc-oxide (IGZO), zinc-indium-oxide (ZIO), zinc-gallium-oxide (ZGO), and zinc-tin-oxide (ZTO), and
   wherein the passivation layer is one of a silicon nitride (SiNx) layer, a silicon oxide nitride (SiON) layer, and a silicon oxide (SiOx) layer.

4. The device according to claim 1, wherein the hydrogen blocking layer includes one of indium-tin-oxide (ITO), indium-zinc-oxide (IZO), molybdenum (Mo), molybdenum-titanium alloy (MoTi), copper (Cu), silver (Ag), gold (Au), Ti, zirconium (Zr), thorium (Th), vanadium (V), palladium (Pd), nickel (Ni), and tin (Sn).

5. The device according to claim 1, further comprising:
   an additional passivation layer between the oxide semiconductor layer and the planarization layer, and
   a gate line, a data line, and a power line on the substrate, the gate and data lines crossing each other to define a pixel region,
   wherein the emitting diode includes a first electrode on the additional passivation layer and in the pixel region, an emitting layer on the first electrode, and a second electrode on the emitting layer, and
   wherein the hydrogen blocking layer is formed on the same layer as the first electrode.

6. The device according to claim 5, wherein the hydrogen blocking layer is formed of the same material as the first electrode.

7. The device according to claim 1, wherein the hydrogen blocking layer is disposed between the passivation layer and the emitting diode.

8. The device according to claim 1, further comprising:
   a gate line, a data line, and a power line on the substrate, the gate and data lines crossing each other to define a pixel region,
   an additional passivation layer between the oxide semiconductor layer and the planarization layer,
   wherein the emitting diode includes a first electrode on the additional passivation layer and in the pixel region, an emitting layer on the first electrode, and a second electrode on the emitting layer, and
   wherein the hydrogen blocking layer is disposed on the second electrode.

9. A display panel comprising:
   the organic light emitting diode display device according to claim 1; and
   a display region, including the passivation layer of the display device,
   wherein the hydrogen blocking layer of the display device is under the passivation layer and surrounds the display region.

10. The display panel according to claim 9, wherein a first surface of the hydrogen blocking layer contacts the passivation layer, and a second surface of the hydrogen blocking layer contacts the planarization layer, and
    wherein the second surface is larger than the first surface.

11. A method of fabricating an organic light emitting diode display device, the method comprising:
    forming a first substrate;
    forming an oxide semiconductor layer over the first substrate;
    forming a planarization layer over the oxide semiconductor layer;
    forming an emitting diode over the planarization layer;
    forming a passivation layer over the emitting diode;

forming a second substrate on the passivation layer; and forming a hydrogen blocking layer between the planarization layer and the passivation layer to block hydrogen diffusion from the passivation layer to the oxide semiconductor layer.

12. The method according to claim 11, further comprising:

forming a gate line, a data line, and a power line on the substrate, the gate and data lines crossing each other to define a pixel region; and forming a thin film transistor in the pixel region, wherein the thin film transistor includes the oxide semiconductor layer of an oxide semiconductor material, and wherein the hydrogen blocking layer has an area that is larger than an area of the oxide semiconductor layer.

13. The method according to claim 12, wherein the oxide semiconductor layer includes one of indium-gallium-zinc-oxide (IGZO), zinc-indium-oxide (ZIO), zinc-gallium-oxide (ZGO), and zinc-tin-oxide (ZTO), and wherein the passivation layer is one of a silicon nitride (SiNx) layer, a silicon oxide nitride (SiON) layer, and a silicon oxide (SiOx) layer.

14. The method according to claim 11, wherein the hydrogen blocking layer includes one of indium-tin-oxide (ITO), indium-zinc-oxide (IZO), molybdenum (Mo), molybdenum-titanium alloy (MoTi), copper (Cu), silver (Ag), gold (Au), Ti, zirconium (Zr), thorium (Th), vanadium (V), palladium (Pd), nickel (Ni), and tin (Sn).

15. The method according to claim 11, further comprising:

forming an additional passivation layer between the oxide semiconductor layer and the planarization layer, forming a gate line, a data line, and a power line on the substrate, the gate and data lines crossing each other to define a pixel region, wherein the emitting diode includes a first electrode on the additional passivation layer and in the pixel region, an emitting layer on the first electrode, and a second electrode on the emitting layer, and wherein the hydrogen blocking layer is formed on the same layer as the first electrode.

16. The method according to claim 15, wherein the hydrogen blocking layer is formed of the same material as the first electrode.

17. The method according to claim 11, wherein the hydrogen blocking layer is disposed between the passivation layer and the emitting diode.

18. The method according to claim 11, further comprising:

forming a gate line, a data line, and a power line on the substrate, the gate and data lines crossing each other to define a pixel region; and forming an additional passivation layer between the oxide semiconductor layer and the planarization layer, wherein the emitting diode includes a first electrode on the additional passivation layer and in the pixel region, an emitting layer on the first electrode, and a second electrode on the emitting layer, and wherein the hydrogen blocking layer is disposed on the second electrode.

19. The method according to claim 11, further comprising:

providing a display panel including a display region, wherein the display region comprises the passivation layer, and wherein the hydrogen blocking layer is-under the passivation layer and surrounds the display region.

20. The method according to claim 19, wherein a first surface of the hydrogen blocking layer contacts the passivation layer, and a second surface of the hydrogen blocking layer contacts the planarization layer, and wherein the second surface is larger than the first surface.

* * * * *